(12) United States Patent
Chen et al.

(10) Patent No.: US 10,886,405 B2
(45) Date of Patent: Jan. 5, 2021

(54) SEMICONDUCTOR STRUCTURE

(71) Applicant: MACRONIX INTERNATIONAL CO., LTD., Hsinchu (TW)

(72) Inventors: Yung-Hsiang Chen, Taipei (TW); Yao-Wen Chang, Zhubei (TW); Chu-Yung Liu, Yuanlin (TW); I-Chen Yang, Miaoli County (TW); Hsin-Wen Chang, Toufen (TW)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 900 days.

(21) Appl. No.: 15/371,293

(22) Filed: Dec. 7, 2016

(65) Prior Publication Data
US 2018/0158950 A1 Jun. 7, 2018

(51) Int. Cl.
| | | |
|---|---|---|
| *H01L 29/78* | (2006.01) | |
| *H01L 29/08* | (2006.01) | |
| *H01L 29/10* | (2006.01) | |
| *H01L 27/112* | (2006.01) | |
| *H01L 29/66* | (2006.01) | |
| *H01L 29/06* | (2006.01) | |

(52) U.S. Cl.
CPC .... *H01L 29/7838* (2013.01); *H01L 27/11286* (2013.01); *H01L 29/0623* (2013.01); *H01L 29/0847* (2013.01); *H01L 29/1045* (2013.01); *H01L 29/1083* (2013.01); *H01L 29/66659* (2013.01); *H01L 29/7835* (2013.01)

(58) Field of Classification Search
CPC ............. H01L 29/7838; H01L 29/7835; H01L 29/1045; H01L 29/66659; H01L 29/0623; H01L 29/0847; H01L 29/1083; H01L 27/11286
See application file for complete search history.

(56) References Cited

U.S. PATENT DOCUMENTS

| | | | | |
|---|---|---|---|---|
| 5,594,264 A * | 1/1997 | Shirahata | ........ | H01L 21/823807 257/335 |
| 8,319,316 B2 * | 11/2012 | Kutsukake | ...... | H01L 21/823418 257/611 |
| 8,664,720 B2 * | 3/2014 | Shrivastava | ........ | H01L 27/0727 257/347 |
| 9,786,657 B1 * | 10/2017 | Dersch | ................ | H01L 27/0629 |
| 2006/0006470 A1 | 1/2006 | Harada | | |

(Continued)

*Primary Examiner* — Stephen W Smoot
*Assistant Examiner* — Sun Mi Kim King
(74) *Attorney, Agent, or Firm* — McClure, Qualey & Rodack, LLP (57) ABSTRACT

A semiconductor structure includes a first source/drain region, a second source/drain region, a channel doping region, a gate structure, a first well and a second well. The second source/drain region is disposed opposite to the first source/drain region. The channel doping region is disposed between the first source/drain region and the second source/drain region. The gate structure is disposed on the channel doping region. The first well has a first portion disposed under the first source/drain region. The second well is disposed opposite to the first well and separated from the second source/drain region. The first source/drain region, the second source/drain region and the channel doping region have a first conductive type. The first well and the second well have a second conductive type different from the first conductive type.

18 Claims, 9 Drawing Sheets

(56) References Cited

U.S. PATENT DOCUMENTS

| | | | |
|---|---|---|---|
| 2008/0224191 A1* | 9/2008 | Ahn | H01L 27/14609 |
| | | | 257/292 |
| 2011/0300680 A1 | 12/2011 | Gomikawa et al. | |
| 2012/0007138 A1 | 1/2012 | Nguyen | |
| 2012/0061761 A1 | 3/2012 | Makiyama et al. | |
| 2014/0197467 A1 | 7/2014 | Hsu et al. | |
| 2015/0255595 A1* | 9/2015 | Hebert | H01L 29/66598 |
| | | | 257/344 |

* cited by examiner

"SEMICONDUCTOR STRUCTURE"

TECHNICAL FIELD

This disclosure relates to a semiconductor structure, and more particularly to a semiconductor structure including a depletion-type MOSFET.

BACKGROUND

The Transistor is one of the most important types of electronic components in the modern electronic devices. The transistors may be used as amplifiers, switches, and/or the like. The metal-oxide-semiconductor field-effect transistor (MOSFET), among others, is the most widely used transistor now in both digital and analog circuits. Most of the MOSFETs are enhancement-type MOSFETs. Others are depletion-type MOSFETs. In an enhancement-type MOSFET, the conducting channel between the source and the drain is substantially not existed in general, and is formed by, for example, applying a voltage to the gate. In contrast, in a depletion-type MOSFET, the channel is previously formed by ion implantation, and the transistor is turned off by, for example, applying a voltage.

SUMMARY

This disclosure is directed to a semiconductor structure, and more particularly to a semiconductor structure provided with a depletion-type MOSFET structure.

According to some embodiments, a semiconductor structure comprises a first source/drain region, a second source/drain region, a channel doping region, a gate structure, a first well and a second well. The first source/drain region has a first conductive type. The second source/drain region is disposed opposite to the first source/drain region. The second source/drain region has the first conductive type. The channel doping region is disposed between the first source/drain region and the second source/drain region. The channel doping region has the first conductive type. The gate structure is disposed on the channel doping region. The first well has a first portion disposed under the first source/drain region. The first well has a second conductive type different from the first conductive type. The second well is disposed opposite to the first well and separated from the second source/drain region. The second well has the second conductive type.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

DETAILED DESCRIPTION

Various embodiments will be described more fully hereinafter with reference to accompanying drawings. Generally, only the differences with respect to individual embodiments are described. To facilitate understanding, identical reference numerals have been used, where possible, to designate identical elements that are common to the figures. The terms used to illustrate spatial relationships, such as "on", "under", "adjacent to", or the like, may encompass both the conditions of directly contact and indirectly contact unless the term "directly" is used in the illustration. It is contemplated that elements and features of one embodiment may be beneficially incorporated in another embodiment without further recitation.

Figure 1:
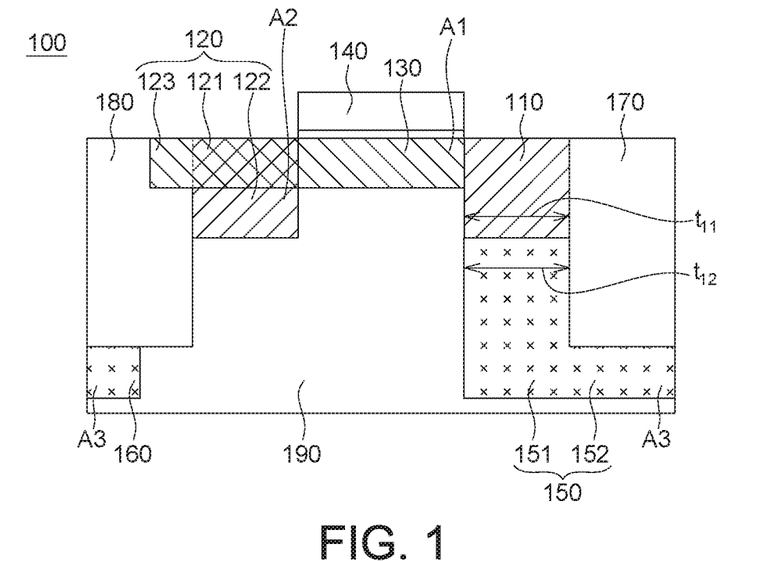
FIG. 1 shows a semiconductor structure according to one embodiment.

Referring to FIG. 1, a semiconductor structure 100 according to one embodiment is shown. In particular, the structure of a transistor is illustrated in FIG. 1. The semiconductor structure 100 comprises a first source/drain region 110, a second source/drain region 120, a channel doping region 130, a gate structure 140, a first well 150 and a second well 160. The second source/drain region 120 is disposed opposite to the first source/drain region 110. For example, the first source/drain region 110 may be a drain region, and the second source/drain region 120 may be a source region. Alternatively, the first source/drain region 110 may be a source region, and the second source/drain region 120 may be a drain region. The channel doping region 130 is disposed between the first source/drain region 110 and the second source/drain region 120. The gate structure 140 is disposed on the channel doping region 130. The first well 150 has a first portion 151 disposed under the first source/drain region 110. The second well 160 is disposed opposite to the first well 150 and separated from the second source/drain region 120. The first source/drain region 110, the second source/drain region 120 and the channel doping region 130 have a first conductive type. The first well 150 and the second well 160 have a second conductive type different from the first conductive type. For example, the first conductive type may be n-type, and the second conductive type may be p-type. Alternatively, the first conductive type may be p-type, and the second conductive type may be n-type.

More specifically, the semiconductor structure 100 may further comprise a first isolation structure 170 and a second isolation structure 180. For example, the first isolation structure 170 and the second isolation structure 180 may be shallow trench isolation structures disposed in a substrate of semiconductor structure 100. The second isolation structure 180 is disposed opposite to the first isolation structure 170.

The first source/drain region 110, the second source/drain region 120 and the channel doping region 130 are disposed between the first isolation structure 170 and the second isolation structure 180, wherein the first source/drain region 110 is at a position close to the first isolation structure 170, and the second source/drain region 120 is at a position close to the second isolation structure 180. The first well 150 may have a second portion 152 disposed under the first isolation structure 170. The second well 160 is disposed under the second isolation structure 180.

The semiconductor structure 100 may further comprise an intrinsic region 190, which is neither of n-type nor of p-type. The intrinsic region 190 may be a portion of a silicon substrate of semiconductor structure 100 that remains intrinsic after ion implantation processes (such as those will be described below). The first source/drain region 110, the second source/drain region 120, the channel doping region 130, the first well 150, the second well 160, the first isolation structure 170 and the second isolation structure 180 are disposed in the intrinsic region 190. The first source/drain region 110, the second source/drain region 120, the channel doping region 130, the first well 150, the second well 160 and the second isolation structure 180 directly contact the intrinsic region 190.

The first source/drain region 110, the second source/drain region 120 and the channel doping region 130 may be formed by two ion implantation steps using, for example, a n-type dopant such as As or the like. In one of the two ion implantation steps, the dopant is implanted into the first implantation area A1, which is indicated by backslashes. In the other one of the two ion implantation steps, the dopant is implanted into the second implantation area A2, which is indicated by front slashes. The dopants used in the two ion implantation steps may be the same or not, so as their concentrations. In this embodiment, the first source/drain region 110 is formed merely by the ion implantation step corresponding to the first implantation area A1. The channel doping region 130 is formed merely by the ion implantation step corresponding to the second implantation area A2. However, the first implantation area A1 and the second implantation area A2 overlap at the position of the second source/drain region 120. The second source/drain region 120 formed thereby may comprise a first region 121 and a second region 122, wherein the first region 121 is on the second region 122, and a doping concentration of the first region 121 is higher than a doping concentration of the second region 122. Further, the second implantation area A2 may overlap with the second isolation structure 180. As such, the second source/drain region 120 may protrude into the second isolation structure 180. More specifically, a third region 123 of the second source/drain region 120 protrudes into the second isolation structure 180, as shown in FIG. 1, wherein the third region 123 is adjacent to the first region 121, and the doping concentration of the first region 121 is higher than a doping concentration of the third region 123. The doping concentrations of the first region 121, the second region 122 and the third region 123 may be of the same order of magnitude.

The first well 150 and the second well 160 may be formed by an ion implantation step using, for example, a p-type dopant. In this implantation step, the dopant is implanted into the third implantation area A3. The first well 150 formed thereby may have the first portion 151 that directly contacts the first source/drain region 110. In this embodiment, a thickness $t_{11}$ of the first source/drain region 110 is equal to a thickness $t_{12}$ of the first portion 151 of the first well 150. As such, a continuous side edge is formed from the first source/drain region 110 to the first portion 151 of the first well 150. The second well 160 may completely expose the second source/drain region 120. Further, in a projection plane parallel to the top surface of the substrate, the second source/drain region 120 and the second well 160 do not overlap with each other.

The elements as described above may be used to constitute a transistor. More specifically, the semiconductor structure 100 may comprise a depletion-type MOSFET, which includes the first source/drain region 110, the second source/drain region 120, the channel doping region 130, the gate structure 140 and the first well 150. The depletion-type MOSFET may have a minus threshold voltage ($V_T<0$) provided by the channel doping region 130.

Figure 2:
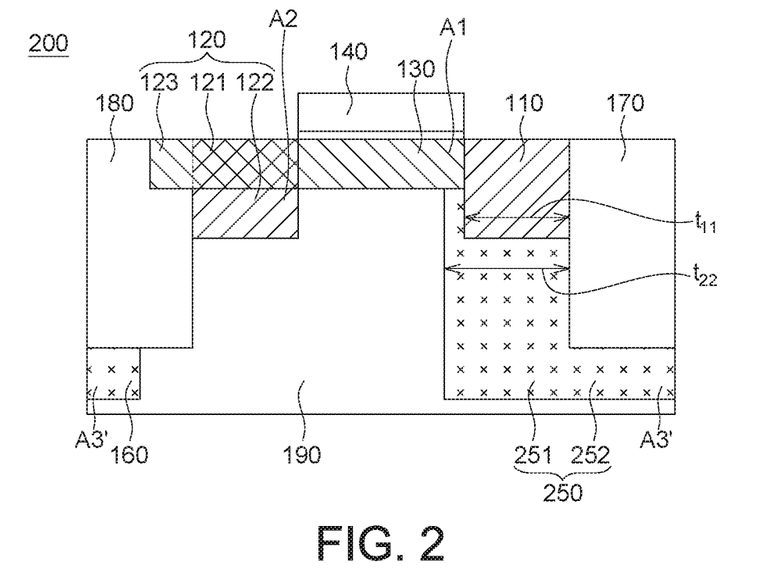
FIG. 2 shows a semiconductor structure according to one embodiment.

Now referring to FIG. 2, a semiconductor structure 200 according to another embodiment is shown. The semiconductor structure 200 differs from the semiconductor structure 100 in that the semiconductor structure 200 has a larger third implantation area A3'. The first well 250 formed thereby has a thicker first portion 251. As such, a thickness $t_{22}$ of the first portion 251 of the first well 250 is larger than a thickness $t_{11}$ of the first source/drain region 110. The first source/drain region 110 may be surrounded by the first portion 251 of the first well 250 and separated from the intrinsic region 190.

Figure 3:
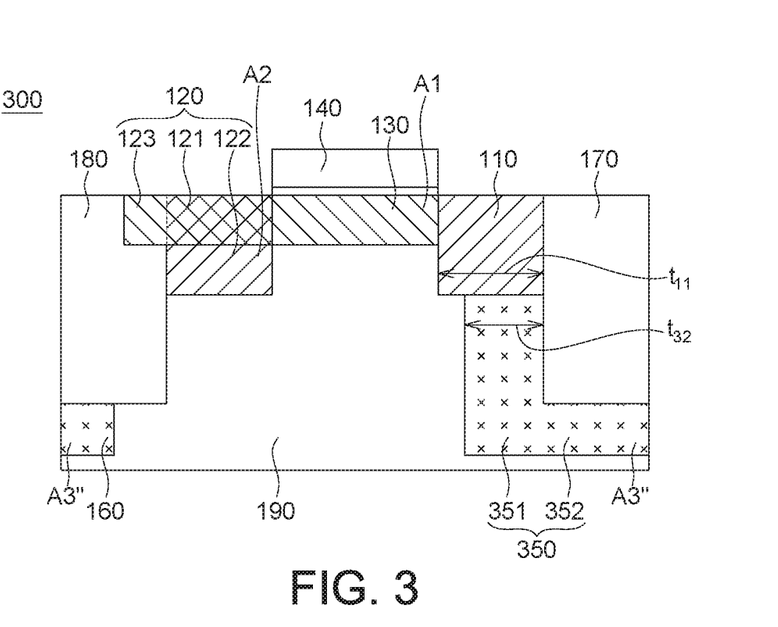
FIG. 3 shows a semiconductor structure according to one embodiment.

Referring to FIG. 3, a semiconductor structure 300 according to another embodiment is shown. The semiconductor structure 300 differs from the semiconductor structure 100 in that the semiconductor structure 300 has a smaller third implantation area A3". The first well 350 formed thereby has a thinner first portion 351. As such, a thickness $t_{11}$ of the first source/drain region 110 is larger than a thickness $t_{32}$ of the first portion 351 of the first well 350. A portion of the bottom surface of the first source/drain region 110 may be exposed by the first portion 351 of the first well 350.

Figure 4:
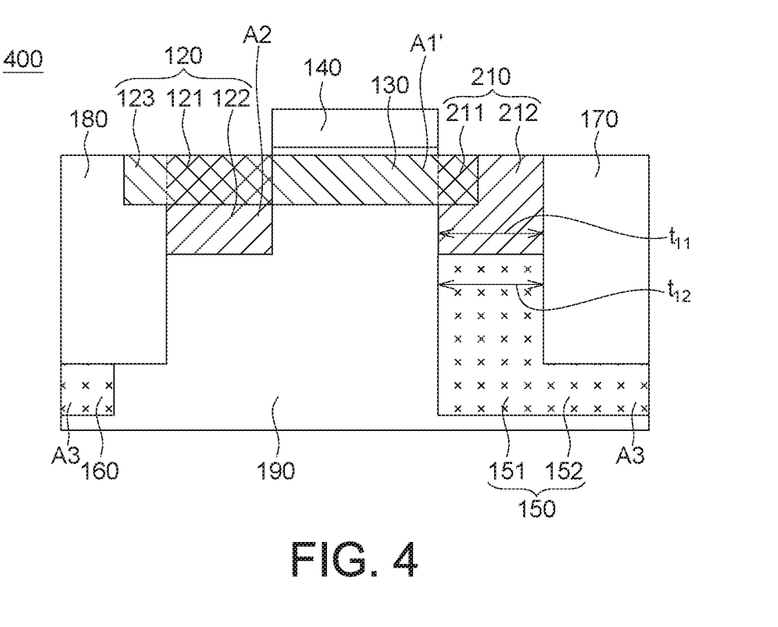
FIG. 4 shows a semiconductor structure according to one embodiment.

Referring to FIG. 4, a semiconductor structure 400 according to still another embodiment is shown. The semiconductor structure 400 differs from the semiconductor structure 100 in that the semiconductor structure 400 has a larger first implantation area A1', which overlaps with the second implantation area A2 at the position of the first source/drain region 210. As such, the first source/drain region 210 comprises a first region 211 and a second region 212, wherein the first region 211 is located in an upper portion of the second region 212 and directly contacts the channel doping region 130, and a doping concentration of the first region 211 is higher than a doping concentration of the second region 212.

Figure 5:
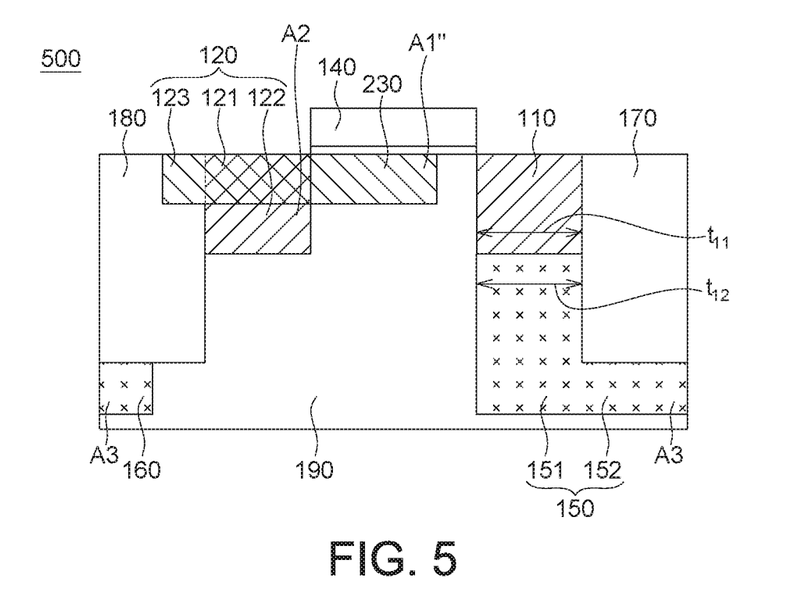
FIG. 5 shows a semiconductor structure according to one embodiment.
Figure 6:
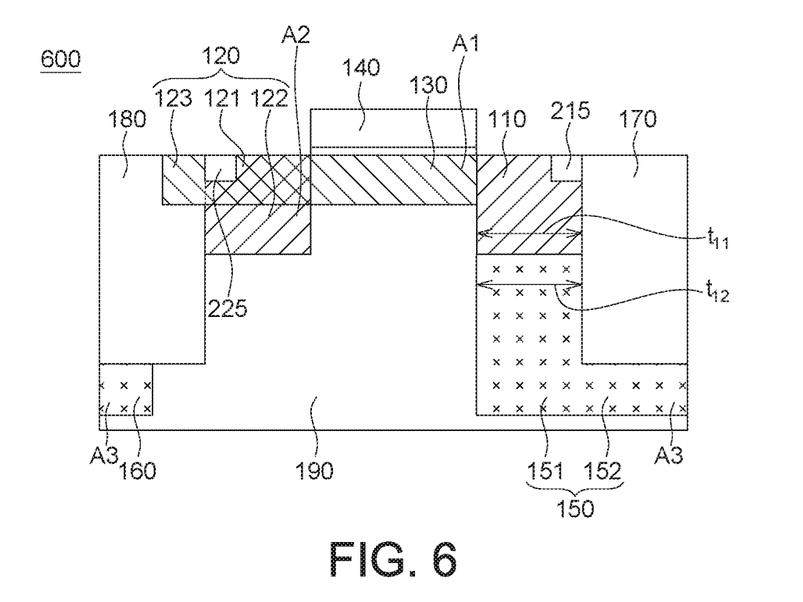
FIG. 6 shows a semiconductor structure according to one embodiment.
Figure 7:
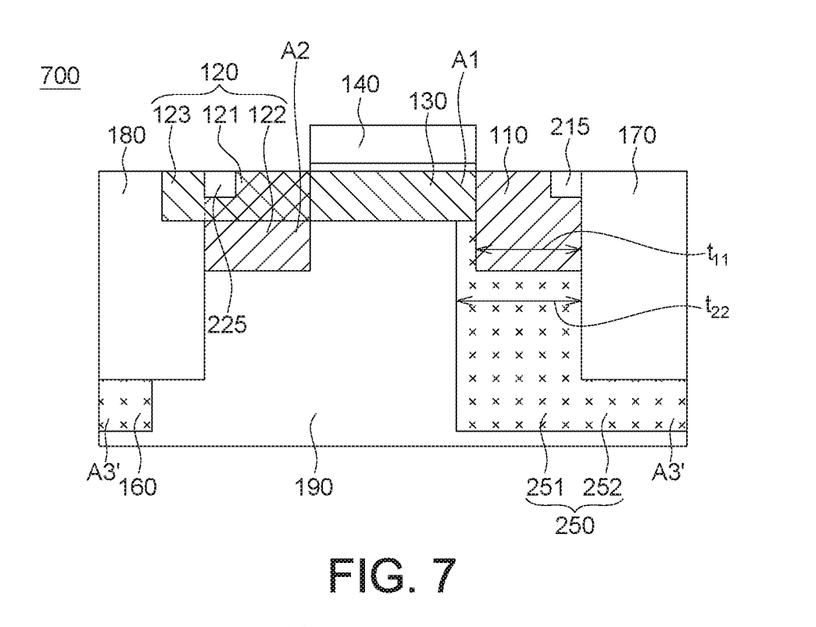
FIG. 7 shows a semiconductor structure according to one embodiment.
Figure 8:
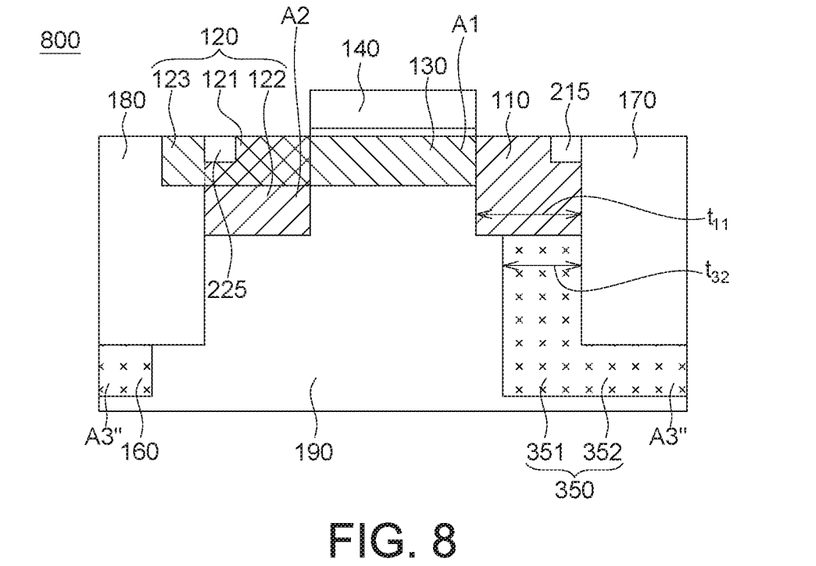
FIG. 8 shows a semiconductor structure according to one embodiment.
Figure 9:
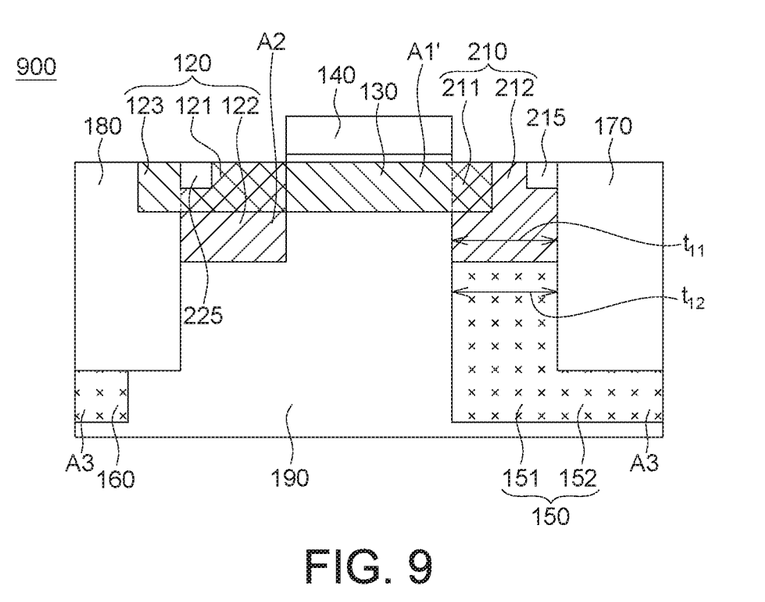
FIG. 9 shows a semiconductor structure according to one embodiment.
Figure 10:
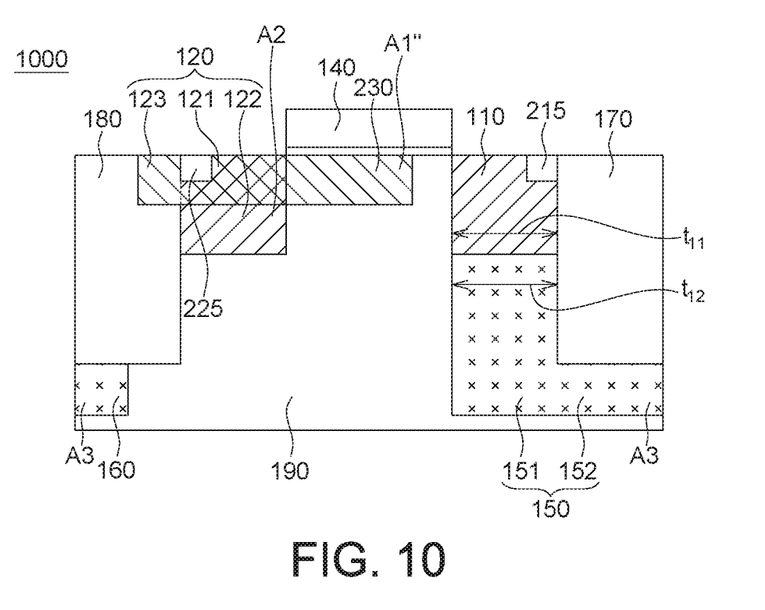
FIG. 10 shows a semiconductor structure according to one embodiment.

Referring to FIG. 5, a semiconductor structure 500 according to another embodiment is shown. The semiconductor structure 500 differs from the semiconductor structure 100 in that the semiconductor structure 500 has a smaller first implantation area A1". The channel doping region 230 formed thereby is separated from the first source/drain region 110.

FIG. 6 to FIG. 10 shows semiconductor structures 600, 700, 800, 900 and 1000, which are similar to the semiconductor structures 100, 200, 300, 400 and 500, respectively, but further comprise a first source/drain contact 215 and a second source/drain contact 225. The first source/drain contact 215 is disposed in the first source/drain region 110/210. The first source/drain contact 215 has the first conductive type. A doping concentration of the first source/drain contact 215 is higher than a doping concentration of the first source/drain region 110/210. The second source/drain contact 225 is disposed in the second source/drain region 120.

The second source/drain contact 225 has the first conductive type. A doping concentration of the second source/drain contact 225 is higher than a doping concentration of the second source/drain region 120. The doping concentrations of the first source/drain contact 215 and the second source/drain contact 225 and the doping concentrations of the first source/drain region 110/210 and the second source/drain region 120 may be of different orders of magnitude.

Figure 11:
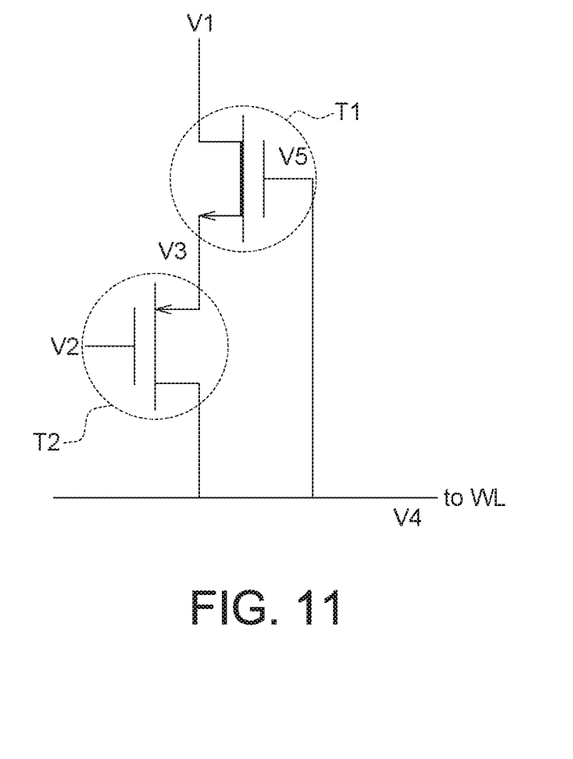
FIG. 11 shows a circuit arrangement of a semiconductor structure according to one embodiment.

According to some embodiments, the semiconductor structure may have a cell region and a periphery region. The semiconductor structure may comprise a word line coupled to memory cells disposed in the cell region. The semiconductor structure may further comprise a switch disposed in the cell region and coupled to the word line, so as to control the signal transferred to the word line. A depletion-type MOSFET having the structure as described above may be used to form the switch. FIG. 11 shows a circuit arrangement of the semiconductor structure. The switch comprises two transistors T1 and T2. The transistor T1 may have a structure as illustrated with reference to any one of FIG. 1 to FIG. 10, wherein the first conductive type is n-type, the second conductive type is p-type, the first source/drain region is a drain region, and the second source/drain region is a source region. In other words, the transistor T1 is a depletion-type NMOSFET according to the embodiments. The transistor T2 may be an enhancement-type PMOSFET.

For example, a program signal, such as a voltage V1 of 28V, may be provided and transferred to the drain of the transistor T1. It passes through the transistor T1, which is generally turned on. As such, a voltage V3 of 28V is transferred from the source of the transistor T1 to the transistor T2. When it is desired to provide the program signal to the word line (WL), the transistor T2 is turned on, such as by applying a voltage V2 of 0V to the gate thereof. As such, a voltage V4 of 28V (i.e., the program signal) can be provided to the word line. Due to the circuit design, the voltage signal is also transferred to the gate of the transistor T1. As such, a voltage V5 of 28V is applied to the gate of the transistor T1 and maintains the turn-on of the transistor T1. When it is not desired to provide the program signal to the word line, the transistor T2 is turned off, such as by applying a voltage V2 of 3.3V to the gate. As such, a voltage V4 of 0V is provided to the word line, and a voltage V5 of 0V is provided to the gate of the transistor T1. The zero voltage V5 will lead to the turn-off of the transistor T1, which may have a threshold voltage of −2.5V. When an equilibrium state is achieved, the voltage V3 may be about 3V.

For the transistor T1 in this circuit design, a large voltage difference exists between the gate and the drain when it is not desired to provide the program signal to the word line. As such, a higher breakdown voltage between the gate and the drain is preferred. In the example described above, the breakdown voltage should be larger than 28V, such as equal to or larger than about 30V. In contrast, such a large voltage difference does not exist between the gate and the source in both conditions. As such, a high breakdown voltage is not necessary between the gate and the source.

In the semiconductor structure according to the embodiments, since the first well 150/250/350, which has the conductive type different from the conductive type of the first source/drain region 110/210, is disposed under the first source/drain region 110/210, a relative doping concentration nearby the gate is decreased due to the compensation effect. In addition, in some of the embodiments, the first implantation area A1/A1" does not extend into the first source/drain region 110. It is advantageous for further decrease the doping concentration nearby the gate at the drain side. As such, a gate-aided breakdown can be suppressed at the drain side, and thus a higher breakdown voltage can be obtained.

While at the source side, the second well 160, which has the conductive type different from the conductive type of the second source/drain region 120, does not extend toward the second source/drain region 120. As such, the threshold voltage will not be seriously affected by the body effect. This is advantageous for the transistor T1 used in the circuit design illustrated above, which should be generally turned-on.

Figure 12A:
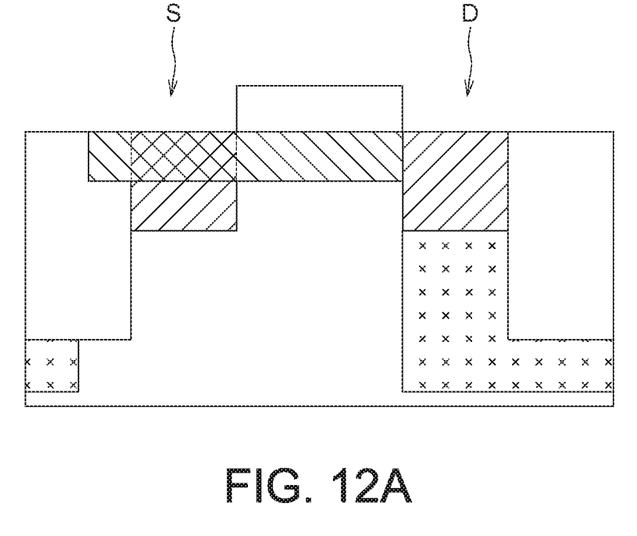
FIGS. 12A-12F show structures and characteristics of a semiconductor structure according to one embodiment and a comparative semiconductor structure.
Figure 12B:
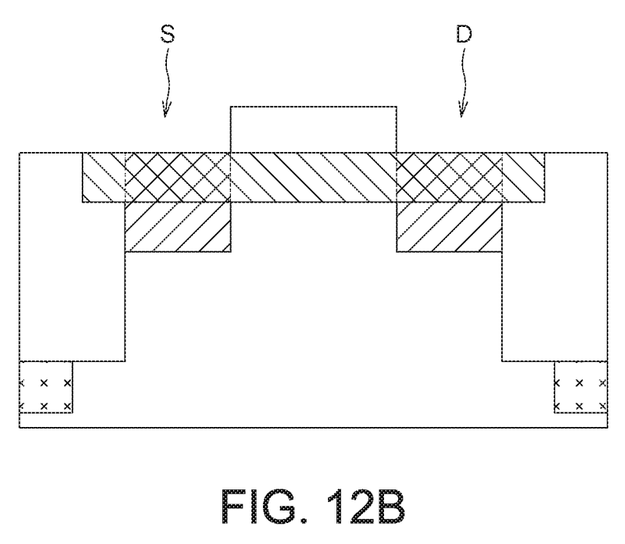
Figure 12C:
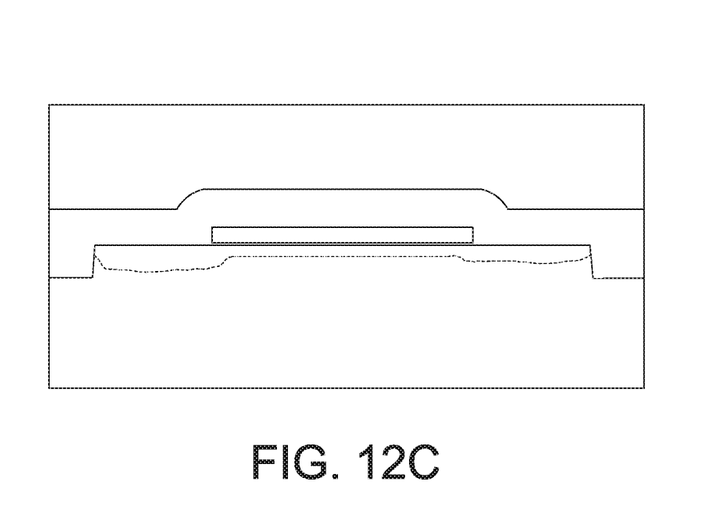
Figure 12D:
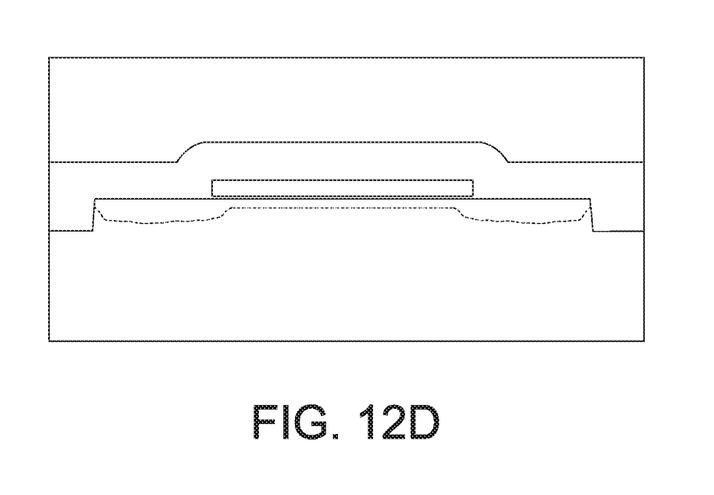
Figure 12E:
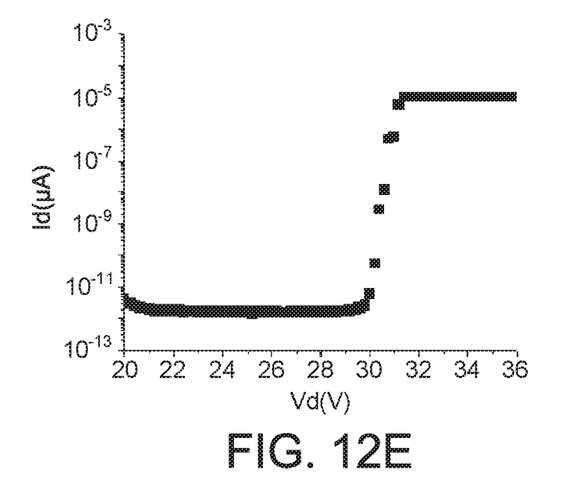
Figure 12F:
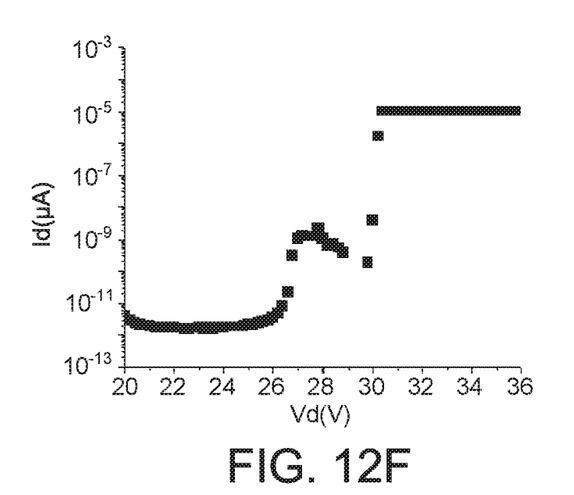

FIGS. 12A-12F show the characteristics of a semiconductor structure according to the embodiments and a comparative semiconductor structure. FIG. 12A shows the structure that is the same as the semiconductor structure 100, which has an asymmetric structure. That is, the configuration at the drain side D is different from the configuration at the source side S. FIG. 12B shows the comparative semiconductor structure, in which the configuration at the drain side D is the same as the configuration at the source side S. FIGS. 12C and 12D show the simulation results of the relative doping concentration profiles corresponding to the structures of FIGS. 12A and 12B, respectively. It can be seen that the semiconductor structure according to the embodiments has an asymmetric relative doping concentration profile (shown by dotted line). The semiconductor structure according to the embodiments has a lower relative doping concentration at the drain side D than at the source side S. A higher breakdown voltage can be obtained because the lower relative doping concentration at the drain side D. FIGS. 12E and 12F show the Id-Vd curves corresponding to the structures of FIGS. 12A and 12B, respectively. As shown in FIG. 12F, in the comparative semiconductor structure, a gate-aided breakdown occurs at about 26V before the junction breakdown at about 30V. While in the semiconductor structure according to the embodiments, as shown in FIG. 12E, the gate-aided breakdown is not observed. A higher breakdown voltage is obtained.

It will be apparent to those skilled in the art that various modifications and variations can be made to the disclosed embodiments. It is intended that the specification and examples be considered as exemplary only, with a true scope of the disclosure being indicated by the following claims and their equivalents.

What is claimed is:

1. A semiconductor structure, comprising:
   a first source/drain region having a first conductive type;
   a second source/drain region disposed opposite to the first source/drain region, the second source/drain region having the first conductive type;
   a channel doping region disposed between the first source/drain region and the second source/drain region, the channel doping region having the first conductive type;
   a gate structure disposed on the channel doping region;
   a first well having a first portion disposed under the first source/drain region, the first well having a second conductive type different from the first conductive type, wherein a sidewall of the first portion of the first well is aligned with a sidewall of the channel doping region; and
   a second well disposed opposite to the first well and separated from the second source/drain region, the second well having the second conductive type.

2. The semiconductor structure according to claim 1, further comprising:
   a first isolation structure; and a second isolation structure disposed opposite to the first isolation structure;

wherein the first source/drain region, the second source/drain region and the channel doping region are disposed between the first isolation structure and the second isolation structure, the first well has a second portion disposed under the first isolation structure, and the second well is disposed under the second isolation structure.

3. The semiconductor structure according to claim 2, wherein the second source/drain region protrudes into the second isolation structure.

4. The semiconductor structure according to claim 1, wherein the first portion of the first well directly contacts the first source/drain region.

5. The semiconductor structure according to claim 1, wherein the second well completely exposes the second source/drain region.

6. The semiconductor structure according to claim 1, wherein the second source/drain region comprises a first region and a second region, the first region is on the second region, and a doping concentration of the first region is higher than a doping concentration of the second region.

7. The semiconductor structure according to claim 1, wherein the first source/drain region comprises a first region and a second region, the first region is located in an upper portion of the second region and directly contacts the channel doping region, and a doping concentration of the first region is higher than a doping concentration of the second region.

8. The semiconductor structure according to claim 1, wherein the channel doping region is separated from the first source/drain region.

9. The semiconductor structure according to claim 1, further comprising:
a first source/drain contact disposed in the first source/drain region, the first source/drain contact having the first conductive type, wherein a doping concentration of the first source/drain contact is higher than a doping concentration of the first source/drain region; and
a second source/drain contact disposed in the second source/drain region, the second source/drain contact having the first conductive type, wherein a doping concentration of the second source/drain contact is higher than a doping concentration of the second source/drain region.

10. The semiconductor structure according to claim 1, wherein the first conductive type is n-type, and the second conductive type is p-type.

11. The semiconductor structure according to claim 1, wherein the first conductive type is p-type, and the second conductive type is n-type.

12. The semiconductor structure according to claim 1, wherein the first source/drain region is a drain region, and the second source/drain region is a source region.

13. The semiconductor structure according to claim 1, wherein the first source/drain region is a source region, and the second source/drain region is a drain region.

14. The semiconductor structure according to claim 1, comprising a depletion-type MOSFET including the first source/drain region, the second source/drain region, the channel doping region, the gate structure and the first well.

15. The semiconductor structure according to claim 14, wherein the depletion-type MOSFET has a minus threshold voltage.

16. The semiconductor structure according to claim 14, having a cell region and a periphery region, wherein the semiconductor structure comprises:
a word line coupled to memory cells disposed in the cell region; and
a switch disposed in the cell region, the switch coupled to the word line, the switch comprising the depletion-type MOSFET.

17. A semiconductor structure, comprising:
a first source/drain region having a first conductive type;
a second source/drain region disposed opposite to the first source/drain region, the second source/drain region having the first conductive type;
a channel doping region disposed between the first source/drain region and the second source/drain region, the channel doping region having the first conductive type;
a gate structure disposed on the channel doping region;
a first well having a first portion disposed under the first source/drain region, the first well having a second conductive type different from the first conductive type; and
a second well disposed opposite to the first well and separated from the second source/drain region, the second well having the second conductive type, wherein a thickness of the first source/drain region is equal to a thickness of the first portion of the first well.

18. A semiconductor structure, comprising:
a first source/drain region having a first conductive type;
a second source/drain region disposed opposite to the first source/drain region, the second source/drain region having the first conductive type;
a channel doping region disposed between the first source/drain region and the second source/drain region, the channel doping region having the first conductive type;
a gate structure disposed on the channel doping region;
a first well having a first portion disposed under the first source/drain region, the first well having a second conductive type different from the first conductive type;
a second well disposed opposite to the first well and separated from the second source/drain region, the second well having the second conductive type; and
an intrinsic region, wherein the first source/drain region, the second source/drain region, the channel doping region, the first well and the second well are disposed in and directly contact the intrinsic region.

\* \* \* \* \*